United States Patent
Hwang

(10) Patent No.: US 7,884,391 B2
(45) Date of Patent: Feb. 8, 2011

(54) IMAGE SENSOR AND METHOD FOR MANUFACTURING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 22 days.

(21) Appl. No.: 12/344,559

(22) Filed: Dec. 28, 2008

(65) Prior Publication Data
US 2009/0179295 A1    Jul. 16, 2009

(30) Foreign Application Priority Data

Dec. 28, 2007  (KR) ............... 10-2007-0139744
Jun. 30, 2008  (KR) ............... 10-2008-0062696

(51) Int. Cl.
*H01L 31/0328* (2006.01)

(52) U.S. Cl. ............... 257/184; 257/187; 257/257; 257/291; 257/E31.058

(58) Field of Classification Search ............... 257/184, 257/187, 257, 291
See application file for complete search history.

(56) References Cited

U.S. PATENT DOCUMENTS

2005/0035381 A1 * 2/2005 Holm et al. ............... 257/290

2007/0037312 A1   2/2007 Noh
2007/0170478 A1 * 7/2007 Araki ............... 257/292

FOREIGN PATENT DOCUMENTS

| KR | 10-2004-0042830 | 12/2005 |
| KR | 10-2005-0117674 | 12/2005 |
| KR | 10-2005-0074445 | 2/2007 |
| KR | 10-2007-0019452 | 2/2007 |

* cited by examiner

*Primary Examiner*—Wai-Sing Louie
(74) *Attorney, Agent, or Firm*—Sherr & Vaughn, PLLC

(57) ABSTRACT

Embodiments relate to an image sensor. According to embodiments, an image sensor may include a metal interconnection, readout circuitry, a first substrate, a metal layer, and an image sensing device. The metal interconnection and the readout circuitry may be formed on and/or over the first substrate. The image sensing device may include a first conduction type conduction layer and a second conduction type conduction layer and may be electrically connected to the metal layer. According to embodiments, an electric field may not be generated on and/or over an Si surface. This may contribute to a reduction in a dark current of a 3D integrated CMOS image sensor.

8 Claims, 6 Drawing Sheets

US 7,884,391 B2

IMAGE SENSOR AND METHOD FOR MANUFACTURING THE SAME

Figure 1:
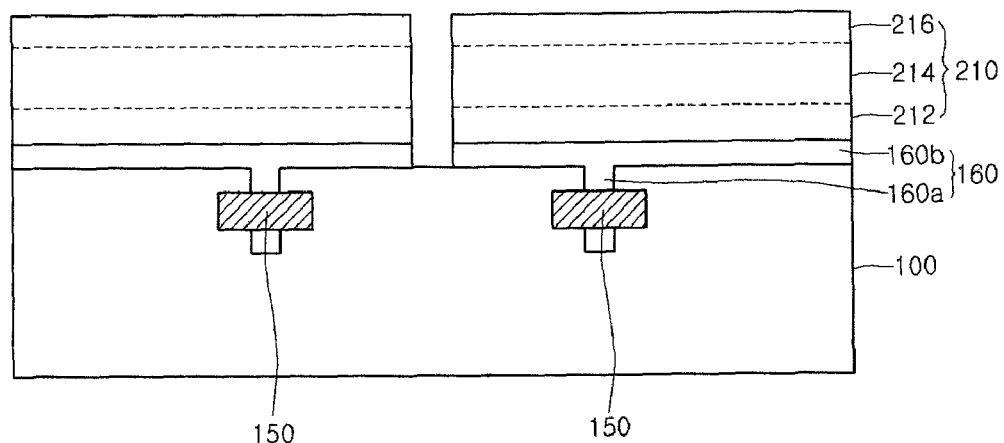

The present application claims priority under 35 U.S.C. 119 to Korean Patent Application No. 10-2007-0139744 (filed on Dec. 28, 2007), and to Korean Patent Application No. 10-2008-0062696 (filed on Jun. 30, 2008), which are hereby incorporated by reference in their entireties.

BACKGROUND

An image sensor may be a semiconductor device that may convert an optical image into an electrical signal. An image sensor may be classified into categories, such as a charge coupled device (CCD) image sensor and a complementary metal oxide silicon (CMOS) image sensor (CIS).

During a fabrication process of an image sensor, a photodiode may be formed in a substrate using ion implantation. A size of a photodiode may be reduced to increase a number of pixels without increasing a chip size. This may reduce an area of a light receiving portion. Image quality may thereby be reduced.

Since a stack height may not reduce as much as a reduction in an area of a light receiving portion, a number of photons incident to a light receiving portion may also be reduced due to diffraction of light called Airy disk.

To address this limitation, a photodiode may be formed using amorphous silicon (Si). In addition, readout circuitry may be formed in a silicon (Si) substrate using a method such as wafer-to-wafer bonding, and a photodiode may be formed on and/or over readout circuitry (referred to as a three-dimensional (3D) image sensor). A photodiode may be connected with readout circuitry through a metal interconnection.

According to the related art, it may be difficult to electrically connect a photodiode to readout circuitry. That is, a metal interconnection may be formed on and/or over readout circuitry and wafer-to-wafer bonding may be performed such that a metal interconnection may contact the photodiode. Hence, a contact between a metal interconnection may be difficult, and an ohmic contact between a metal interconnection and a photodiode may be difficult.

Since both a source and a drain at both sides of a transfer transistor may be heavily doped with N-type impurities, a charge sharing phenomenon may occur. When a charge sharing phenomenon occurs, a sensitivity of an output image may be reduced and an image error may be generated. In addition, because a photo charge may not readily move between a photodiode and readout circuitry, a dark current may be generated and/or saturation and sensitivity may be reduced.

SUMMARY

Embodiments relate to an image sensor and a manufacturing method thereof that may increase physical and electrical contacts between a photodiode and a metal interconnection while increasing a fill factor. Embodiments relate to an image sensor and a manufacturing method thereof that may prevent charge sharing while increasing a fill factor.

Embodiments relate to an image sensor and a manufacturing method thereof that may minimize a dark current source and may prevent a reduction in saturation and sensitivity by providing a relatively swift movement path for a photo charge between a photodiode and a readout circuitry.

According to embodiments, an image sensor may include at least one of the following. A metal interconnection and a readout circuitry over a first substrate. A metal layer on and/or over the metal interconnection. An image sensing device including a first conduction type conduction layer and a second conduction type conduction layer and electrically connected to the metal layer.

According to embodiments, a method for manufacturing an image sensor may include at least one of the following. Forming a metal interconnection and a readout circuitry over a first substrate. Forming a metal layer over the metal interconnection. Forming an image sensing device including a first conduction type conduction layer and a second conduction type conduction layer. Bonding the metal layer and the image sensing device such that the metal layer contacts the image sensing device.

DRAWINGS

Example FIGS. 1 through 10 illustrate an image sensor and a method for manufacturing an image sensor, according to embodiments.

DESCRIPTION

An image sensor and a method for manufacturing an image sensor according to embodiments will be described with reference to the accompanying drawings.

Example FIG. 1 is a sectional view of an image sensor according to embodiments. Referring to example FIG. 1, an image sensor may include metal interconnection 150 and readout circuitry 120 (see FIG. 2B) on and/or over first substrate 100. Metal layer 160 may be provided on and/or over metal interconnection 150. Image sensing device 210, which may include first conduction type conduction layer 214 and second conduction type conduction layer 216, may be electrically connected to metal layer 160.

According to embodiments, image sensing device 210 may be a photodiode, a photogate or any combination thereof. For simplicity in description, it will be referred to a photodiode 210. According to embodiments, a photodiode may be formed in a crystalline semiconductor layer. According to embodiments, a photodiode may not be limited thereto, but may be formed in other layer types, including in an amorphous semiconductor layer.

Figure 2A:
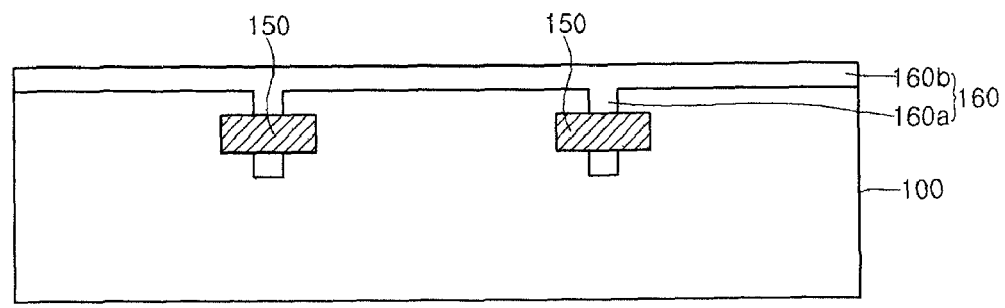

Example FIG. 2A is a schematic view of first substrate 100, which may include metal interconnection 150 and readout circuitry 120, according to embodiments. Example FIG. 2B is another view of first substrate 100, according to embodiments.

Figure 2B:
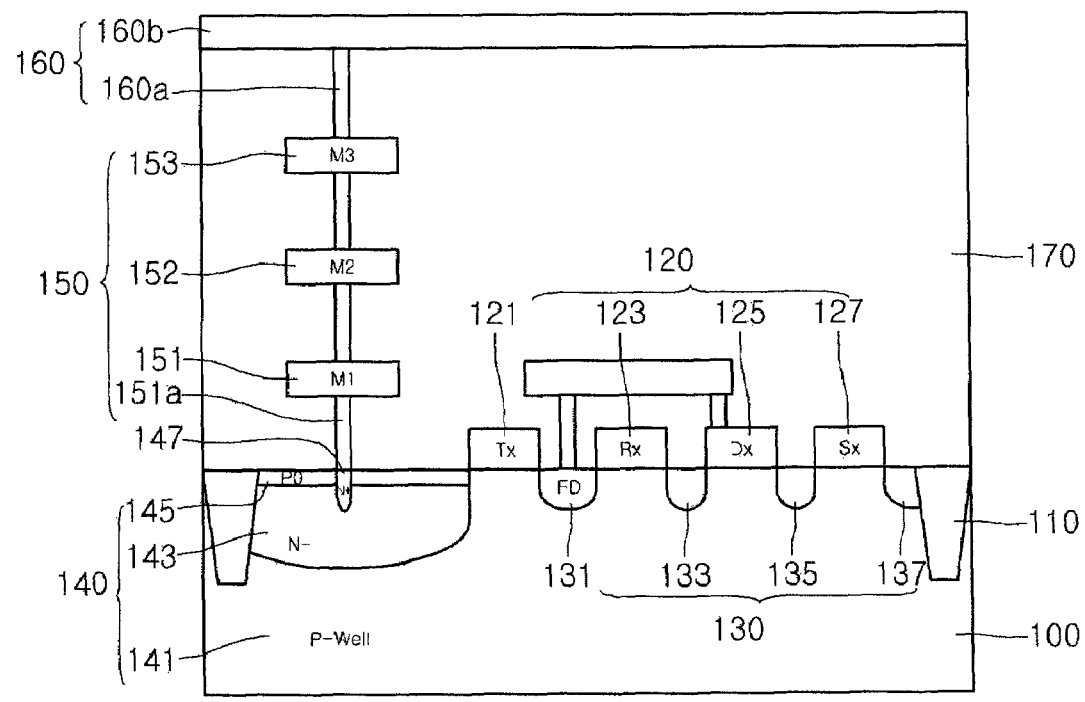

Referring to example FIG. 2B, a method for manufacturing an image sensor according to embodiments may include preparing first substrate 100. Metal interconnection 150 and readout circuitry 120 may be formed on and/or over first substrate 100. According to embodiments, first substrate 100 may be a second conduction type substrate. According to embodiments, first substrate 100 may not be limited to a second conduction type substrate, but could be any conduction type.

According to embodiments, device isolation layer 110 may be formed in second conduction type first substrate 100 and may define an active region. Readout circuitry 120, which may include at least one transistor, may be formed in the active region. According to embodiments, readout circuitry 120 may include transfer transistor (Tx) 121, reset transistor (Rx) 123, drive transistor (Dx) 125, and select transistor (Sx) 127. Floating diffusion region (FD) 131 of ion implantation regions 130, which may include source/drain regions 133, 135, and 137 of respective transistors may be formed.

According to embodiments, forming readout circuitry 120 on and/or over first substrate 100 may include forming electrical junction region 140 in first substrate 100 and forming first conduction type connection region 147 in an upper region of electrical junction region 120. According to embodiments, first conduction type connection region 147 may be electrically connected to metal interconnection 150.

According to embodiments, electrical junction region 140 may be a PN junction, but may not be limited thereto. According to embodiments, electrical junction region 140 may include first conduction type ion implantation layer 143 formed on and/or over second conduction type well 141 and/or a second conduction type epitaxial layer, and may include second conduction type ion implantation layer 145 formed on and/or over first conduction type ion implantation layer 143. According to embodiments, PN junction 140 may be a P0 (145)/N− (143)/P− (141) junction. PN junction 140 may not be limited to such a configuration, however, and may be any junction configuration.

According to embodiments, a device may be designed such that there may be a potential difference between a source and drain on both sides of transfer transistor (Tx) 121. This may allow a photo charge to be fully dumped. Accordingly, a photo charge generated from a photodiode may be fully dumped to a floating diffusion region. This may maximize a sensitivity of an output image.

Electrical junction region 140 may be formed in first substrate 100, and may be proximally located to readout circuitry 120. Electrical junction region 140 may permit generation of a potential difference between a source and a drain on both sides of transfer transistor (Tx) 121. This may allow a photo charge to be fully dumped.

Hereinafter, a dumping structure of a photo charge will be further described, according to embodiments. Unlike a node of floating diffusion region (FD) 131, which may be an N+ junction, P/N/P junction 140, which may be electrical junction region 140 and to which an applied voltage may not be fully transferred, may be pinched-off at a predetermined voltage. This voltage may be called a pinning voltage, and may depend on doping concentrations of P0 region 145 and N− region 143.

According to embodiments, an electron generated from photodiode 210 may move to PNP junction 140, and may be transferred to a node of floating diffusion region (FD) 131. It may then be converted into a voltage if transfer transistor (Tx) 121 is turned on.

According to embodiments, since a maximum voltage value of P0/N−/P− junction 140 may become a pinning voltage, and a maximum voltage value of a node of floating diffusion region (FD) 131 may become threshold voltage Vth of Vdd-Rx 123, an electron generated from photodiode 210 in an upper portion of a chip may be fully dumped to a node of floating diffusion region (FD) 131. This may be done without charge sharing due to a potential difference between both sides of transfer transistor (Tx) 131.

According to embodiments, a P0/N−/P−well junction, not an N+/P−well junction, may be formed in a silicon substrate such as first substrate 100. Hence, a + voltage may be applied to N− 143 of P0/N−/P−well junction and a ground voltage may be applied to P0 145 and P−well 141 during a 4-Tr active pixel sensor (APS) reset operation. A pinch-off may thus be generated to P0/N−/P−well double junction at a predetermined voltage or more. This may be similar to a bipolar junction transistor (BJT) structure. This may be called a pinning voltage. According to embodiments, a potential difference may be generated between a source and a drain at both sides of transfer transistor (Tx) 121, which may prevent a charge sharing phenomenon during on/off operations of transfer transistor (Tx) 121.

According to embodiments, unlike a case where a photodiode may simply be connected to an N+ junction, limitations such as saturation reduction and sensitivity reduction may be avoided.

According to embodiments, first conduction type connection region 147 may be formed between a photodiode and readout circuitry and may provide a relatively swift movement path of a photo charge. This may minimize a dark current source, and may prevent saturation reduction and sensitivity reduction.

According to embodiments, first conduction type connection region 147 for ohmic contact, for example, N+ region 147, may be formed on and/or over a surface of P0/N−/P− junction 140. N+ region 147 may be formed and may extend through P0 region 145 and contact N− region 143. According to embodiments, to prevent first conduction type connection region 147 from becoming a leakage source, a width of first conduction type connection region 147 may be minimized. Therefore, according to embodiments, a plug implant may be performed after first metal contact 151a may be etched. According to embodiments, a process may not be limited thereto. For example, an ion implantation pattern may be formed and first conduction type connection region 147 may then be formed using the ion implantation pattern as an ion implantation mask.

According to embodiments, by locally and heavily doping only a contact forming portion with N-type impurities, ohmic contact formation may be facilitated while minimizing a dark signal. If an entire transfer transistor source were heavily doped, a dark signal may be increased by a Si surface dangling bond.

According to embodiments, interlayer dielectric 160 may be formed on and/or over first substrate 100. Metal interconnection 150 may be formed and may extend through interlayer dielectric 160 and may be electrically connected to first conduction type connection region 147. According to embodiments, metal interconnection 150 may include first metal contact 151a, first metal 151, second metal 152, and third metal 153. According to embodiments, other structures could be used. According to embodiments, metal layer 160 may be formed on and/or over first substrate 100 and may contact metal interconnection 150.

According to embodiments, a bonding force between substrates may be enhanced by interposing metal layer 160 between first substrate 100 and photodiode 210. According to embodiments, metal layer 160 may be an aluminum (Al) layer. According to embodiments, metal layer 160 may be formed of other metals.

According to embodiments, if metal interconnection 150 is not exposed on an upper surface of first substrate 100, metal layer 160 may include plug metal layer 160a, which may contact metal interconnection 150 through a hole. First metal layer 160b may be interposed between first substrate 100 and photodiode 210. According to embodiments, if metal interconnection 150 in first substrate 100 is not exposed without a plug, plug metal layer 160a and first metal layer 160b may be formed by forming a hole which may expose metal interconnection 150. An Al layer may be formed and may have a thickness of approximately 500-1000 Å on and/or over first substrate 100. According to embodiments, other similar processes could also be used. Metal layer 160 may then be planarized.

According to embodiments, if metal interconnection 150 is exposed on an upper surface of first substrate 100, metal layer 160 may include only first metal layer 160b interposed between first substrate 100 and photodiode 210. According to embodiments, if metal interconnection 150 in first substrate 100 is exposed without a plug, first metal layer 160b may be formed by forming metal layer, for example an Al layer, which may have a thickness of approximately 500-1000 Å on and/or over first substrate 100. Metal layer 160 may then be planarized.

According to embodiments, an image sensor having improved physical and electrical bonding force between the photodiode and the metal interconnection may be obtained by using a vertical type photodiode and interposing a metal layer between a vertical photodiode and a metal interconnection prior to bonding.

Figure 3:
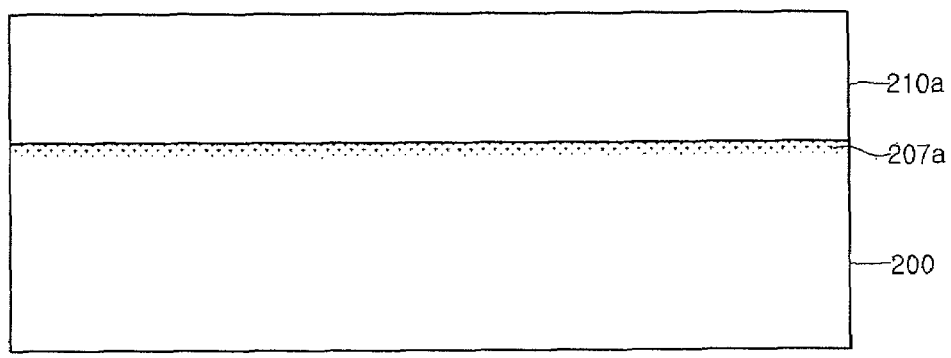

Referring to example FIG. 3, crystalline semiconductor layer 210a may be formed on and/or over second substrate 200. According to embodiments, photodiode 210 may be formed in crystalline semiconductor layer 210a. Accordingly, an image sensing device may adopt a 3-dimentional (3D) image sensor located on and/or over readout circuitry. This may raise a fill factor. According to embodiments, an image sensing device may be formed inside the crystalline semiconductor layer, which may prevent a defect from occurring inside an image sensing device.

According to embodiments, crystalline semiconductor layer 210a may be formed on and/or over second substrate 200 using epitaxial growth. Hydrogen ions may be implanted between second substrate 200 and crystalline semiconductor layer 210a. This may form hydrogen ion implantation layer 207a interposed between second substrate 200 and crystalline semiconductor layer 210a. The implantation of the hydrogen ions may be performed after the ion implantation for forming photodiode 210.

Figure 4:
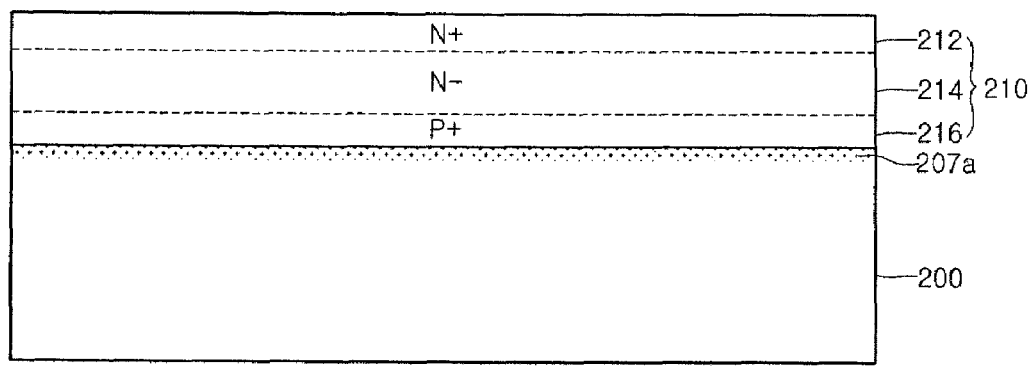

Referring to example FIG. 4, photodiode 210 may be formed in crystalline semiconductor layer 210a using ion implantation. According to embodiments, second conduction type conduction layer 216 may be formed in a lower portion of crystalline semiconductor layer 210a and on and/or over, and may contact, hydrogen ion implantation layer 207a. High concentration P-type conduction layer 216 may be formed in a lower portion of crystalline semiconductor layer 210a by performing a first blanket-ion implantation on and/or over a surface, for example an entire surface, of second substrate 200 without a mask.

According to embodiments, first conduction type conduction layer 214 may be formed on and/or over second conduction type conduction layer 216. For example, low concentration N-type conduction layer 214 may be formed on and/or over second conduction type conduction layer 216 by performing a second blanket-ion implantation on and/or over an entire surface of second substrate 200 without a mask. According to embodiments, high concentration first conduction type conduction layer 212 may be formed on and/or over first conduction type conduction layer 214, for example by performing a third blanket-ion implantation on and/or over an entire surface of second substrate 200 without a mask. This may allow first conduction type conduction layer 214 to contribute to ohmic contact.

Figure 5:
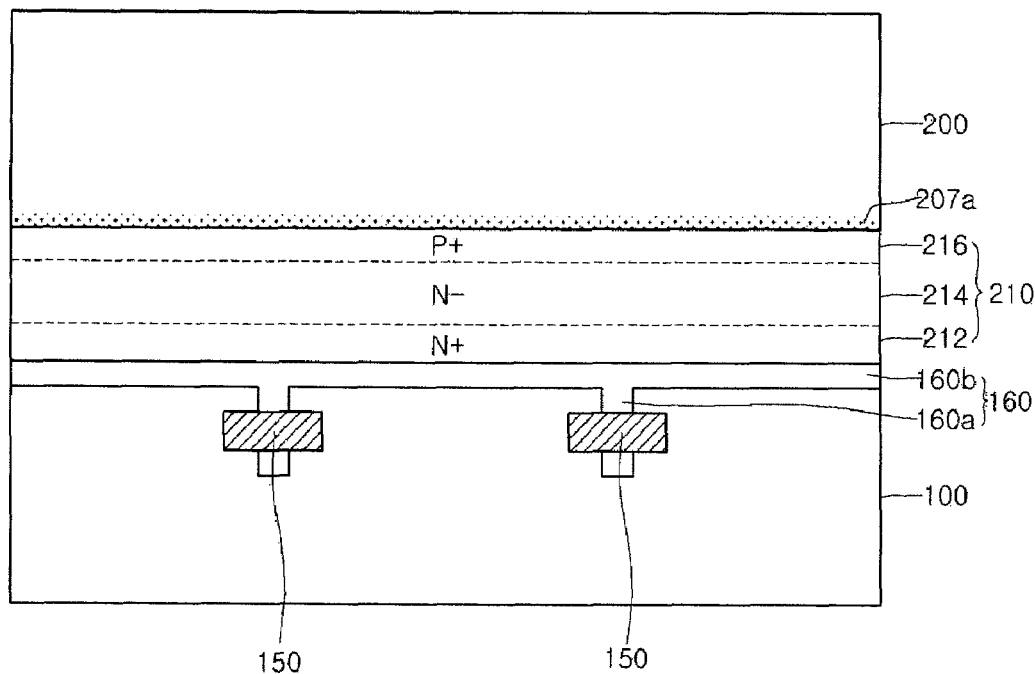

Referring to example FIG. 5, first substrate 100 and second substrate 200 may be bonded. According to embodiments, photodiode 210 may thus contact metal interconnection 150. Before first substrate 100 and second substrate 200 may be bonded to each other, a bonding may be performed by increasing a surface energy of a surface to be bonded, for example through activation by plasma. According to embodiments, bonding may be performed with at least one of a dielectric and a metal layer disposed on and/or over a bonding interface. This may maximize a bonding force.

Figure 6:
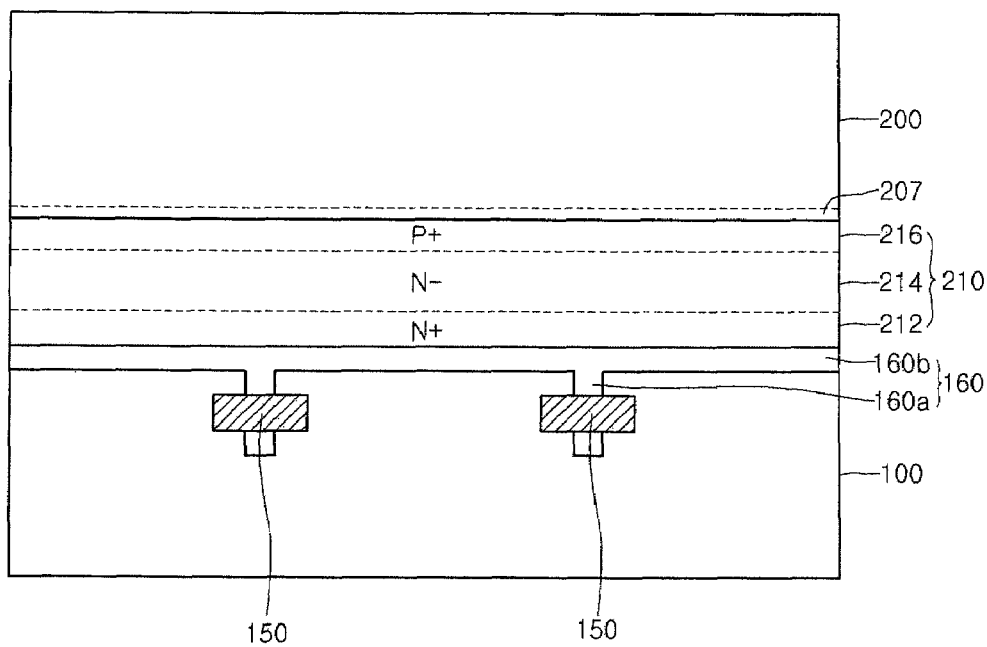

Referring to example FIG. 6, hydrogen ion implantation layer 207a may be changed into a hydrogen gas layer by performing heat treatment to second substrate 200.

Figure 7:
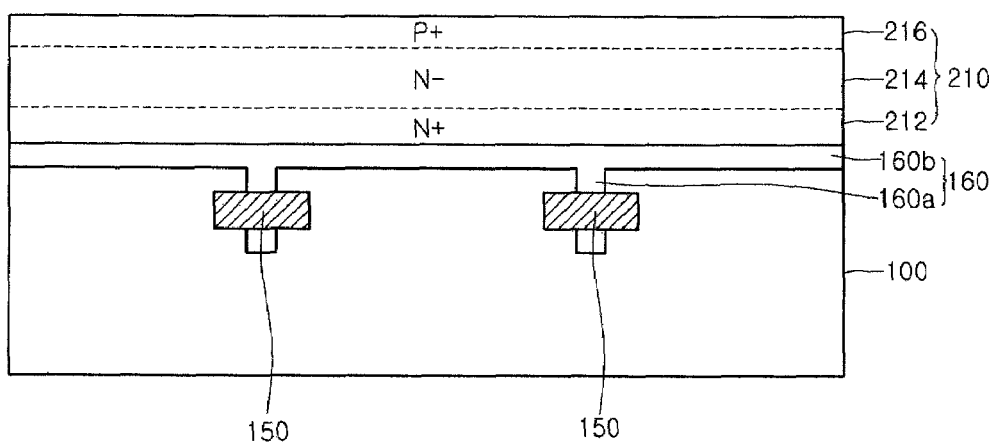

Referring to example FIG. 7, a portion of second substrate 200 may then be removed. According to embodiments, photodiode 210 may be left under the hydrogen gas layer and photodiode 210 may be exposed. According to embodiments, removal of second substrate 200 may be performed using a cutting apparatus such as a blade.

Figure 8:
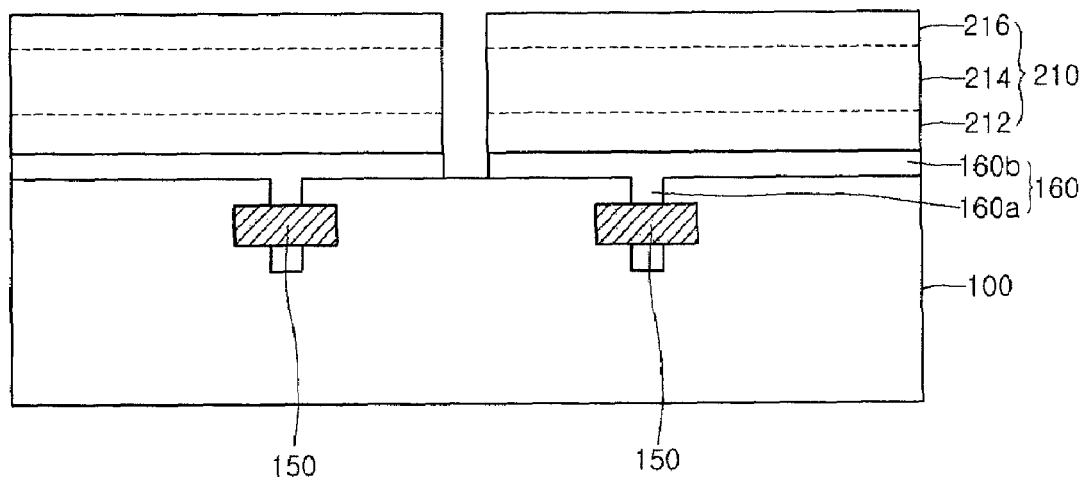

Referring to example FIG. 8, an etching process may be performed and may separate a photodiode for each unit pixel. According to embodiments, an etched portion may be filled with an interpixel dielectric. According to embodiments, processes to form an upper electrode and a color filter may be performed.

Figure 9:
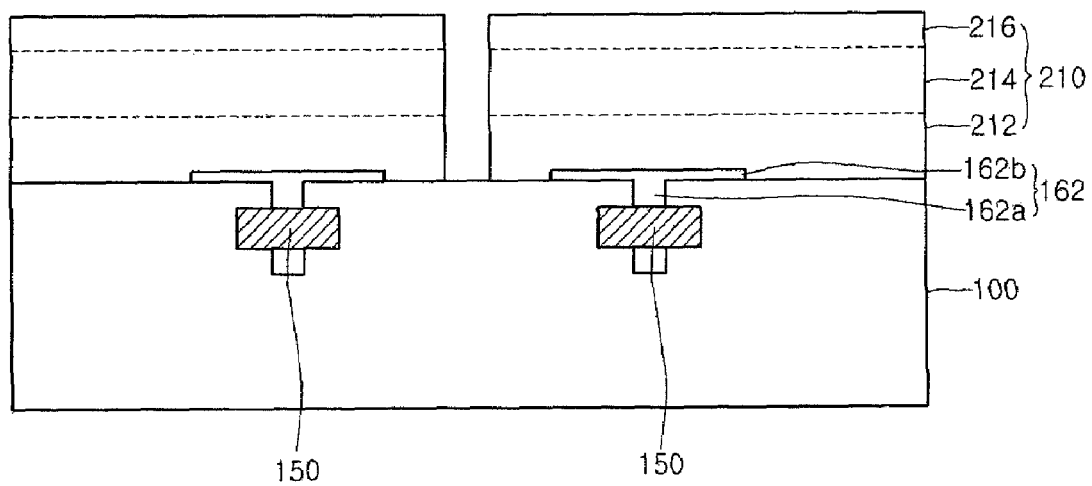

Example FIG. 9 is a sectional view of an image sensor, according to embodiments. Referring to example FIG. 9, an image sensor according to embodiments may include metal interconnection 150 and readout circuitry 120 on and/or over first substrate 100. Metal layer 160 may be provided on and/or over metal interconnection 150. Image sensing device 210, which may include first conduction type conduction layer 214 and second conduction type conduction layer 216, may be electrically connected to metal layer 160. Embodiments illustrated in example FIG. 9 may adopt technical characteristics of embodiments illustrated in example FIGS. 1 through 8.

According to embodiments, metal layer 162 in embodiments illustrated in example FIG. 9 may include plug metal layer 162a, which may contact metal interconnection 150, and second metal layer 162b, which may be selectively interposed between first substrate 100 and photodiode 210. According to embodiments, metal layer 162 may be a titanium (Ti) layer. According to embodiments, metal layer may be any other suitable metal.

According to embodiments, unlike first metal layer 160b in embodiments illustrated in example FIGS. 1 through 8, second metal layer 162b in embodiments illustrated in example FIG. 9 may partially exist between photodiode 210 and first substrate 100.

According to embodiments, if a thin Ti layer having a thickness range of approximately 50-100 Å is interposed between first substrate 100 and photodiode 210, an adhesive force between first substrate 100 and photodiode 210 may be enhanced.

According to embodiments, since second metal layer 162b may be relatively very thin, positioning second metal layer 162b between first substrate 100 and photodiode 210 may not influence generation of a void or the like.

Next, a process of forming metal layer 162 will be described, according to embodiments. According to embodiments, if metal interconnection 150 is not exposed on and/or over an upper surface of first substrate 100, a hole exposing metal interconnection 150 may be formed. According to embodiments, metal layer 162 may be formed. Metal layer 162 may include plug metal layer 162a contacting metal interconnection 150 and second metal layer 162b on and/or over first substrate 100. Second metal layer 162b may then be planarized.

According to embodiments, second metal layer 162b may be selectively removed, which may leave a portion connected to plug metal layer 162a. For example, second metal layer 162b may be patterned to have a width greater than a width of metal interconnection 150.

According to embodiments, as illustrated in example FIGS. 3 and 4, second substrate 200, on and/or over which photodiode 210 may be formed, may be prepared. According to embodiments, as illustrated in example FIGS. 5 through 7, first substrate 100 and second substrate 200 may be bonded to each other. Photodiode 210 may then be exposed.

Referring to example FIG. 9, an etching process separating photodiode 210 for each unit pixel may be performed. An etched portion may be filled with an interpixel dielectric. According to embodiments, processes for forming an upper electrode and a color filter may be performed.

According to embodiments illustrated in example FIG. 9, electrical and physical bonding forces between metal interconnection 150 and photodiode 210 may be enhanced due to metal layer 160 interposed therebetween. According to embodiments, since metal layer 162 may not exist at a boundary between pixels, an etching process to separate metal layer 162 for each unit pixel may not be required.

Figure 10:
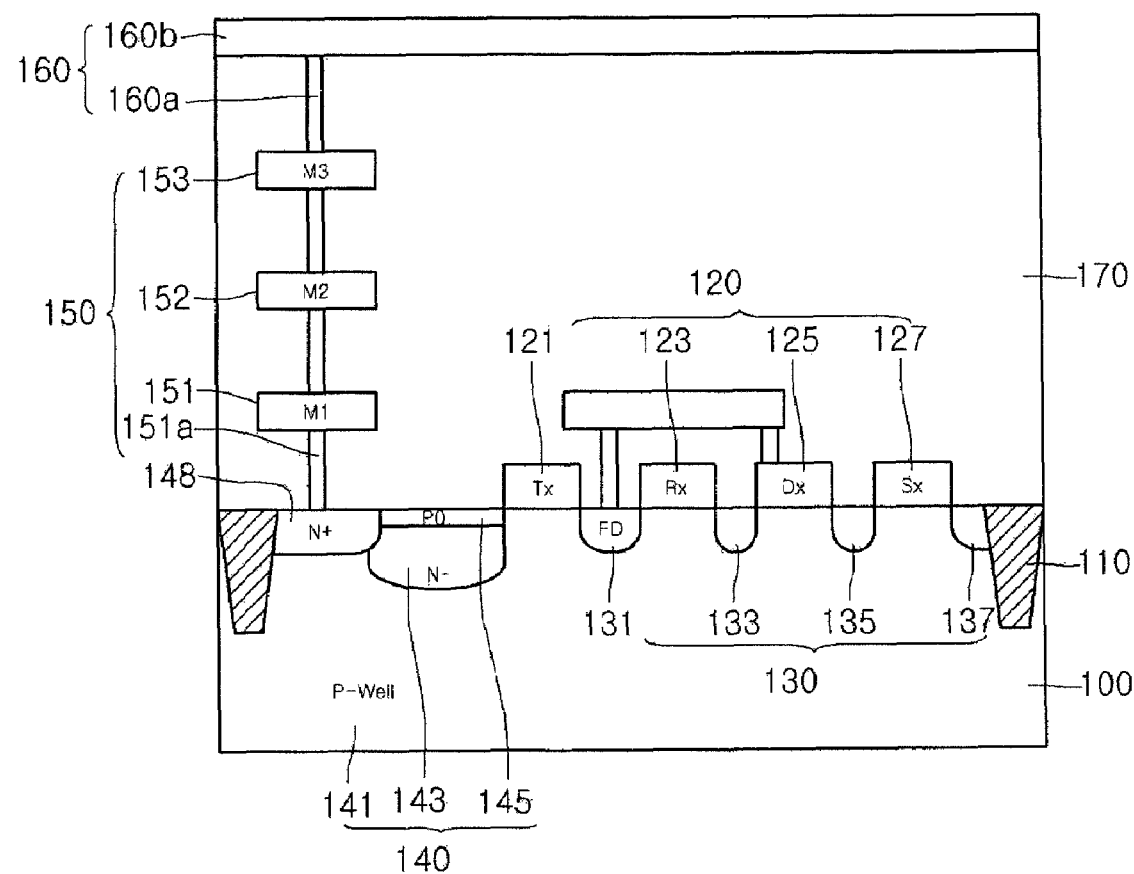

Example FIG. 10 is a sectional view of an image sensor according to embodiments. Example FIG. 10 may illustrate a first substrate on and/or over which metal interconnection 150 may be formed. Embodiments illustrated in example FIG. 10 may incorporate certain technical characteristics of embodiments illustrated in example FIGS. 1 through 8.

For example, since embodiments illustrated in example FIG. 10 may use a vertical type photodiode and may interpose a metal layer between the vertical type photodiode and a metal interconnection, it may be possible to obtain an image sensor with enhanced physical and electrical bonding forces.

According to embodiments illustrated in example FIG. 10, a device may be designed such that there may be a potential difference between a source and a drain on both sides of transfer transistor (Tx). This may allow a photo charge to be fully dumped. According to embodiments, a charge connection region may be formed between a photodiode and readout circuitry. This may provide a relatively swift movement path of a photo charge, which may minimize a dark current source, and may prevent saturation reduction and sensitivity reduction.

Unlike embodiments illustrated in example FIGS. 1 through 8, first conduction type connection region 148 may be formed to be spaced laterally on one side of electrical junction region 140. Alternatively, according to embodiments, N+ connection region 148 for ohmic contact may be formed on and/or over P0/N−/P− junction 140. A process of forming N+ connection region 148 and M1C contact 151a may provide a leakage source because a device may operate with a reverse bias applied to P0/N−/P− junction 140. Accordingly an electric field (EF) may be generated on and/or over an Si surface. A crystal defect that may be generated during a contact forming process inside an electric field may serve as a leakage source.

According to embodiments, if N+ connection region 148 is formed on and/or over a surface of P0/N−/P− junction 140, an electric field may be generated due to N+/P0 junction 148/145. This electric field may also serve as a leakage source.

According to embodiments of example FIG. 10, a layout may be provided in which first contact plug 151a may be formed in an active region not doped with a P0 layer but including N+ connection region 148 and may be connected to N−junction 143.

According to embodiments, an electric field may not be generated on and/or over an Si surface. This may contribute to reduction in a dark current of a 3D integrated CIS.

Although embodiments have been described with respect to a complementary metal oxide semiconductor (CMOS) image sensor, embodiments are not limited thereto. According to embodiments, any image sensor requiring a photodiode may be used.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
   a metal interconnection and a readout circuit over a first substrate;
   a metal layer over the metal interconnection; and
   an image sensing device electrically connected to the metal layer and including a first conduction type conduction layer and a second conduction type conduction layer,
   wherein the readout circuit comprises an electrical junction region in the first substrate, and wherein the electrical junction region comprises:
   a first conduction type ion implantation region in the first substrate; and
   a second conduction type ion implantation region over the first conduction type ion implantation region, and
   wherein the electrical junction region comprises a PNP junction.

2. The device of claim 1, wherein the metal interconnection is not exposed over an upper surface of the first substrate, and wherein the metal layer comprises:
   a plug metal layer contacting the metal interconnection; and
   a first metal layer over the plug metal layer and between the first substrate and the image sensing device.

3. The device of claim 1, wherein the metal interconnection is exposed over an upper surface of the first substrate, and wherein the metal layer comprises a first metal layer between the first substrate and the image sensing device.

4. The device of claim 1, wherein the metal interconnection is not exposed over an upper surface of the first substrate, and wherein the metal layer comprises:
   a plug metal layer contacting the metal interconnection; and
   a first metal layer over the plug metal layer and between a portion the first substrate and the image sensing device.

5. The device of claim 1, comprising a first conduction type connection region electrically connected to the metal interconnection over the electrical junction region.

6. The device of claim 1, comprising a first conduction type connection region spaced away from the electrical junction region and electrically connected to the metal interconnection.

7. The device of claim 1, wherein the readout circuit comprises a transistor, and wherein a potential difference exists between a source and a drain at both sides of the transistor.

8. The device of claim 7, wherein the transistor comprises a transfer transistor, and wherein the source of the transistor has an ion implantation concentration lower than an ion implantation concentration of a floating diffusion region.

* * * * *